US012702022B2

(12) United States Patent
Wu et al.

(10) Patent No.: US 12,702,022 B2
(45) Date of Patent: Aug. 4, 2026

(54) PACKAGE STRUCTURE AND METHOD OF FORMING THE SAME

(71) Applicant: Taiwan Semiconductor Manufacturing Company, Ltd., Hsinchu (TW)

(72) Inventors: Chih-Wei Wu, Yilan County (TW); Wen-Chih Chiou, Miaoli County (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 614 days.

(21) Appl. No.: 18/162,679

(22) Filed: Jan. 31, 2023

(65) Prior Publication Data

US 2024/0136293 A1     Apr. 25, 2024

Related U.S. Application Data

(60) Provisional application No. 63/419,317, filed on Oct. 25, 2022.

(51) Int. Cl.
*H10W 70/60*          (2026.01)
*H10W 70/05*          (2026.01)
(Continued)

(52) U.S. Cl.
CPC .......... *H10W 70/611* (2026.01); *H10W 70/05* (2026.01); *H10W 70/685* (2026.01);
(Continued)

(58) Field of Classification Search
CPC ........... H01L 23/5383; H01L 23/49816; H01L 21/4857; H01L 21/56; H01L 25/105;
(Continued)

(56) References Cited

U.S. PATENT DOCUMENTS

| | | |
|---|---|---|
| 6,917,119 B2 | 7/2005 | Lee et al. |
| 9,000,584 B2 | 4/2015 | Lin et al. |

(Continued)

FOREIGN PATENT DOCUMENTS

| | | |
|---|---|---|
| TW | 201810553 | 3/2018 |
| TW | 202040783 | 11/2020 |
| TW | 202232694 | 8/2022 |

OTHER PUBLICATIONS

"Office Action of Taiwan Counterpart Application", issued on Jan. 19, 2024, p. 1-p. 5.

*Primary Examiner* — Marlon T Fletcher
*Assistant Examiner* — Christina A Sylvia
(74) *Attorney, Agent, or Firm* — JCIPRNET

(57)          ABSTRACT

Provided are a package structure having a joint structure and a method of forming the same. The package structure includes: a first under bump metallurgy (UBM) structure disposed on a first dielectric layer, wherein the first UBM structure at least comprises: a barrier layer embedded in the first dielectric layer; and an upper metal layer disposed over the barrier layer, wherein a sidewall of the barrier layer is laterally offset outward from a sidewall of the upper metal layer, and a portion of a top surface of the barrier layer is exposed by the first dielectric layer; and a solder layer disposed on the first UBM structure and contacting the upper metal layer.

20 Claims, 15 Drawing Sheets

(51) Int. Cl.
   *H10W 70/685*      (2026.01)
   *H10W 74/01*      (2026.01)
   *H10W 90/00*      (2026.01)
   *H10W 72/20*      (2026.01)

(52) U.S. Cl.
   CPC ........... *H10W 74/01* (2026.01); *H10W 90/00*
   (2026.01); *H10W 90/701* (2026.01); *H10W 72/252* (2026.01); *H10W 90/724* (2026.01); *H10W 90/754* (2026.01)

(58) Field of Classification Search
   CPC ......... H01L 24/13; H01L 24/16; H01L 24/48; H01L 2224/13144; H01L 2224/13147; H01L 2224/16227; H01L 2224/48227
   See application file for complete search history.

(56)        References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2011/0317385 A1 | 12/2011 | Zhou et al. |
| 2013/0075906 A1* | 3/2013 | Matsuda .................. H01L 24/05 |
| | | 257/E21.174 |
| 2020/0203265 A1* | 6/2020 | Jung ................. H01L 23/49816 |
| 2022/0148990 A1* | 5/2022 | Chuang .............. H01L 23/3192 |
| 2022/0189895 A1* | 6/2022 | Morita .................... H01L 24/20 |

* cited by examiner

PACKAGE STRUCTURE AND METHOD OF FORMING THE SAME

CROSS REFERENCE TO RELATED APPLICATION

This application claims the priority benefit of U.S. provisional application Ser. No. 63/419,317, filed on Oct. 25, 2022. The entirety of the above-mentioned patent application is hereby incorporated by reference herein and made a part of specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting these new packaging technologies, various packages with different or similar functions can be integrated together.

Although existing package structures and methods of fabricating package structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
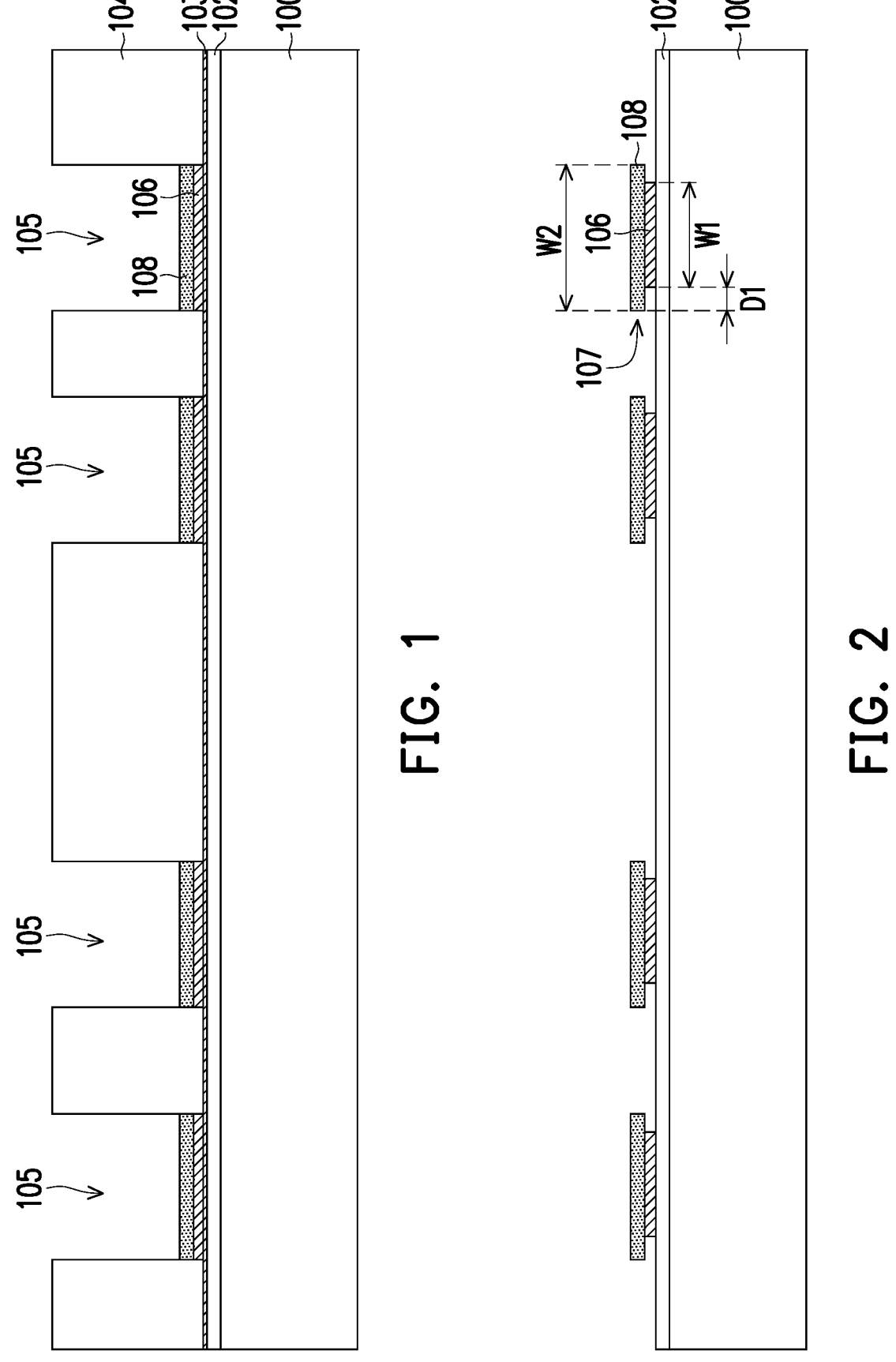
FIG. 1 to FIG. 9 are cross-sectional views of a method of forming package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 9 are cross-sectional views of a method of forming package structure in accordance with some embodiments.

Referring to FIG. 1, a carrier 100 is provided. In some embodiments, the carrier 100 may be a glass carrier or any suitable carrier for the manufacturing method of the package structure. Specifically, the carrier 100 is provided with a de-bonding layer 102 and a dielectric layer 104 formed thereon. In some embodiments, the de-bonding layer 102 functions as a temporary bonding layer suitable for bonding/debonding the carrier 100 from the above layers disposed thereon. In some embodiments, the de-bonding layer 102 is a light-to-heat conversion (LTHC) release layer formed on carrier 100. In some alternative embodiments, the de-bonding layer 102 may be a photo-curable release film whose viscosity is decreased by photo-curing process or a thermal curable release film whose viscosity is decreased by thermal-curing process.

Next, a seed layer 103 is formed on the de-bonding layer 102. In some embodiments, the seed layer 103 may be formed by a chemical vapor deposition (CVD) process or a physical vapor deposition (PVD) process. The PVD process is, for example, sputtering. In some embodiments, the seed layer 103 is a metal layer, which may be a single layer or a composite layer including a plurality of sub-layers formed of different materials. For example, the seed layer 103 is a titanium/copper composited layer, wherein the sputtered titanium thin film is in contact the de-bonding layer 102, and the sputtered copper thin film is then formed over the sputtered titanium thin film. In some alternative embodiments, the seed layer 103 may be other suitable composited layer such as metal, alloy, barrier metal, or a combination thereof.

After forming the seed layer 103, a photoresist pattern 104 may be formed on the seed layer 103. In some embodiments, the photoresist pattern 104 has a plurality of openings 105 exposing the seed layer 103.

Afterward, a metal layer 106 and a barrier layer 108 are sequentially formed in the openings 105. In some embodiments, the metal layer 106 and the barrier layer 108 have different metal materials. More specifically, the barrier layer 108 is configured to have a metal material that is more difficult to form an intermetallic compound (IMC) than the metal layer 106. For example, the metal layer 106 is a copper (Cu) layer, and the barrier layer 108 is a nickel (Ni) layer. However, the embodiments of the present invention are not limited thereto. In some embodiments, the metal layer 106 may be made of copper, aluminum, aluminum copper, or a combination thereof, and the barrier layer 108 may be made of nickel, cobalt, cobalt iron, iron, or a combination thereof. In some embodiments, the metal layer 106 and the barrier layer 108 are independently formed by a deposition process, such as an electroplating process, a PVD process, a CVD process, or another applicable process.

Referring to FIG. 2, after removing the photoresist pattern 104, a first etching process is performed to remove the seed layer 103 uncovered by the metal layer 106 and the barrier layer 108 while laterally etch a portion of the metal layer 106. In this case, a sidewall of the barrier layer 108 may protrude beyond a sidewall of the metal layer 106 to form an overhang structure 107. In some embodiments, the first etching process is used to remove the seed layer 103 and the metal layer 106, but not remove the barrier layer 108. In other words, the first etching process provides a high etching selectivity of the seed layer 103 and the metal layer 106 relative to the barrier layer 108. That is, the etching rate of the seed layer 103 and the metal layer 106 is greater than the etching rate of the barrier layer 108 during the first etching process. In some embodiments, the first etching process includes a wet etching process containing phosphoric acid ($H_3PO_4$) solution, hydrogen peroxide ($H_2O_2$) solution, or a combination thereof. In some alternative embodiments, the first etching process includes a wet etching process using HF and LDPP, which contains TMAH. Although the sidewall of the metal layer 106 of FIG. 2 is illustrated as a vertical sidewall, the embodiments of the present invention are not limited thereto. In other embodiments, the sidewall of the metal layer 106 may have a concave sidewall or a curved sidewall since the first etching process is the wet etching process. Further, hereinafter, the seed layer 103 and the metal layer 106 are merged into a single layer and marked as reference number "106" for clarity.

In some embodiments, the metal layer 106 has a first width W1 in a horizontal direction, and the barrier layer 108 has a second width W2 in the horizontal direction. The second width W2 may be greater than the first width W1. There is a non-zero distance D1 between the sidewall of the barrier layer 108 and the sidewall of the metal layer 106. In some embodiments, the non-zero distance D1 is in a range from about 0.5 μm to about 20 μm, such as 2 μm. It should be noted that, the barrier layer 108 has the overhang structure 107 to prevent the to-be-formed solder layer 160 (FIG. 9) from flowing downward. Therefore, the reliability of the package structure is improved by forming the extended barrier layer 108.

Figures 3, 4:
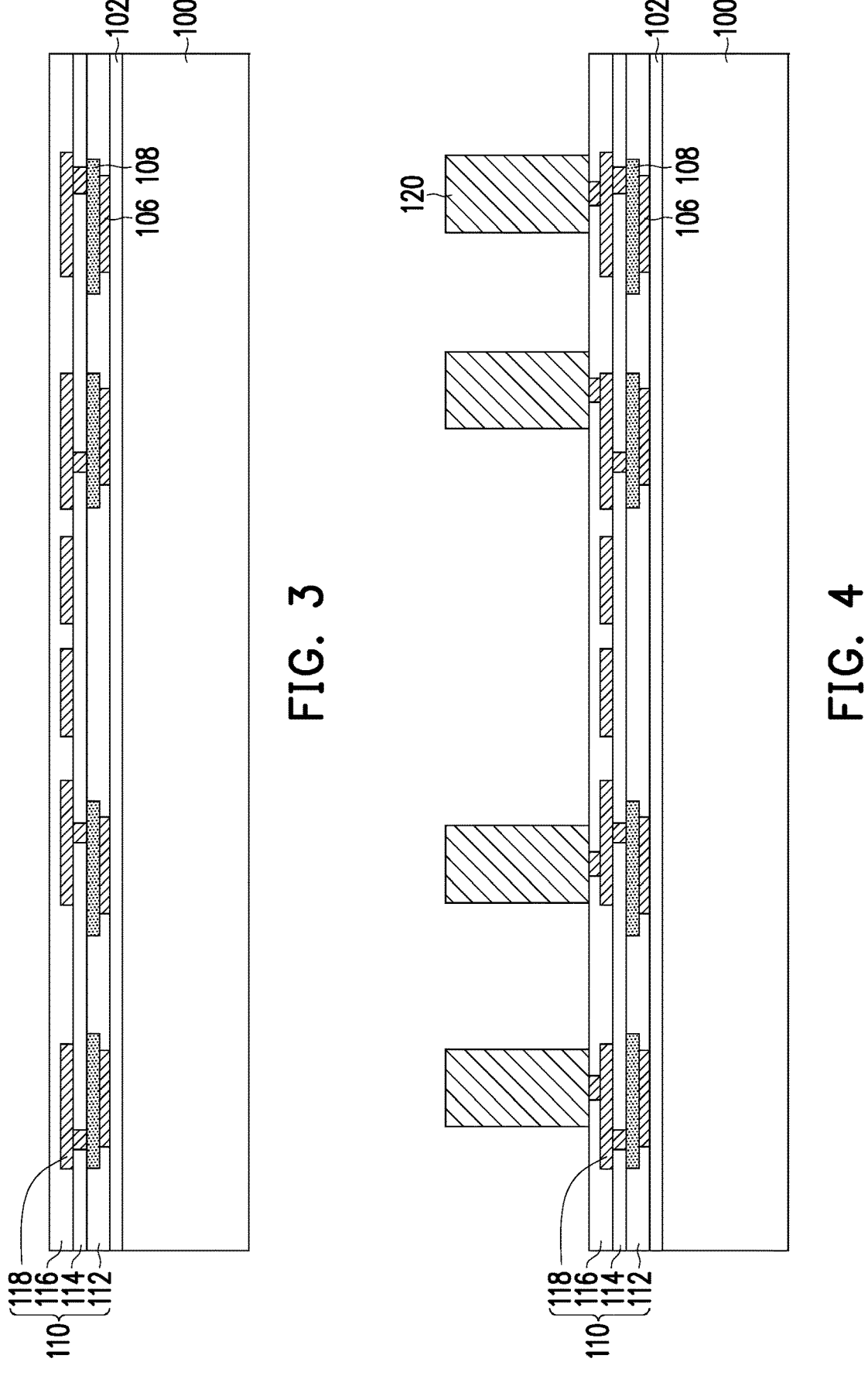

Referring to FIG. 3 to FIG. 7, a first package component 710 is formed on the carrier 100. In detail, as shown in FIG. 3, a redistribution layer (RDL) structure 110 is formed on the carrier 100. In some embodiments, the RDL structure 110 includes a plurality of dielectric layers 112, 114, and 116 and a redistribution layer 118 stacked alternately. The number of the dielectric layers or the redistribution layers is not limited by the disclosure.

In some embodiments, the dielectric layer 112 laterally encapsulates the metal layer 106 and the barrier layer 108. The dielectric layer 114 may be formed on the dielectric layer 112 and overlay the barrier layer 108. The redistribution layer 118 may penetrate through the dielectric layer 114 to electrically connect to the barrier layer 108. The dielectric layer 116 may be formed on the dielectric layer 114 and overlay the redistribution layer 118. In some embodiments, the dielectric layers 112, 114, and 116 are referred to as polymer layers which include a photo-sensitive material such as polybenzoxazole (PBO), polyimide (PI), benzocyclobutene (BCB), a combination thereof or the like. In some embodiments, the redistribution layer 118 includes a conductive material. The conductive material may include metal such as copper, nickel, titanium, a combination thereof or the like, and are formed by an electroplating process. In some embodiments, the redistribution layer 118 includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layer 118 includes a plurality of vias and a plurality of traces connected to each other. The vias penetrate through the dielectric layer 114 and connect to the traces, and the traces are respectively located on the dielectric layer 114, and are respectively extending on the top surface of the dielectric layer 114.

Referring to FIG. 4, a plurality of through insulator vias (TIVs) 120 are respectively formed on the RDL structure 110. In detail, the TIVs 120 may penetrate through the dielectric layer 116 to electrically connect to the redistribution layer 118 and the underlying metal layer 106 and the underlying buffer layer 108. In some embodiments, the TIVs 120 are formed by photolithography, plating, and photoresist stripping process. For example, the TIVs 120 include copper posts. In detail, the TIVs 120 may be formed by following steps including forming a plurality of lower openings in the dielectric layer 116, forming a seed layer (not shown) on the dielectric layer 116 by a CVD process or a PVD process (e.g., sputtering), forming a photoresist pattern with a plurality of upper openings on the seed layer, forming a conductive material (not shown) in the upper openings by a plating process, and removing the photoresist pattern and the seed layer covered by the photoresist pattern. In the case, the TIVs 120 may include the conductive material and underlying seed layer. In some alternative embodiments, the TIVs 120 are obtained by the manufacturer may be mounted on the RDL structure 110. In some embodiments, the TIV 120 has a concave sidewall in a cross-sectional view.

Figure 5:
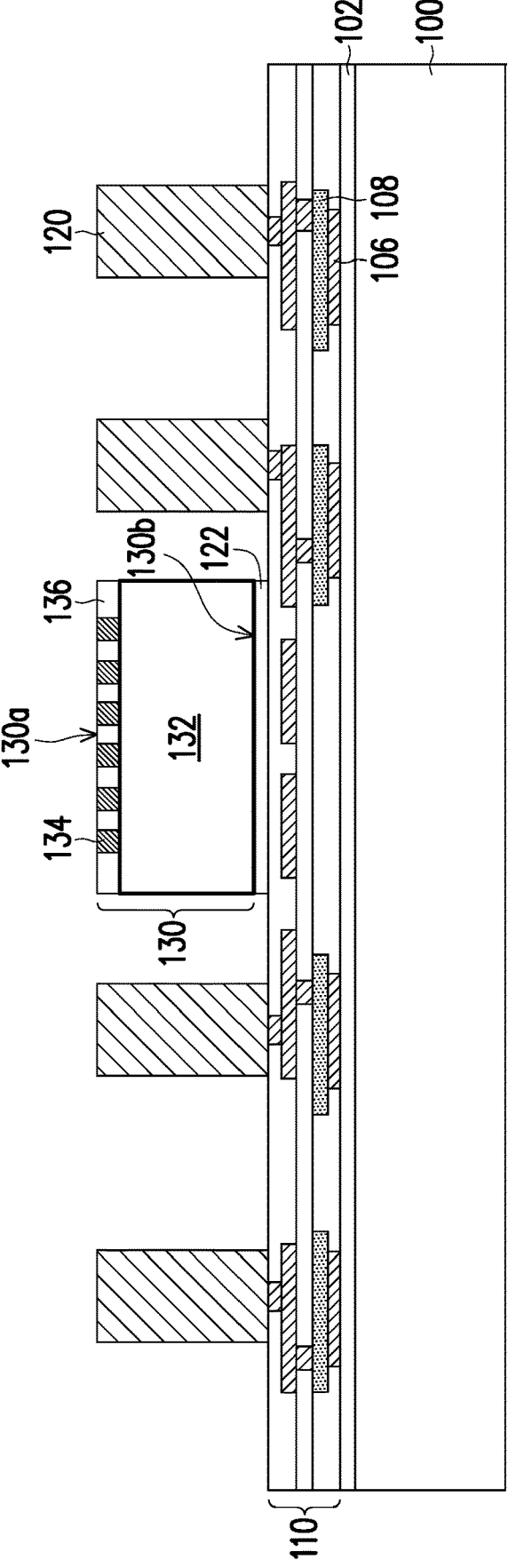

After forming the TIVs 120, as shown in FIG. 4, an accommodation space is surrounded or built-up by the TIVs 120. In some embodiments, the accommodation space is used to mount a die 130 (as shown in FIG. 5). In some alternative embodiments, a size of the accommodation space may be adjusted by changing the number and/or the arrangement of the TIVs 120. For example, when the first TIVs 120 includes less than two conductive vias, the size of the accommodation space will become greater to accommodate greater die 130 or more than one die 130. On the other hand, the size of the accommodation space may be adjusted by changing the height of the TIVs 120. That is, the size of the accommodation space will become greater when the height of the TIVs 120 is getting greater.

Referring to FIG. 5, the die 130 is picked and placed onto the RDL structure 110 by an adhesive layer 122 such as a die attach film (DAF), silver paste, or the like. In some embodiments, the die 130 is mounted in the accommodation space which is laterally surrounded by the TIVs 120. In some embodiments, the die 130 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the die 130 includes a memory die such as high bandwidth memory (HBM) die. Although only one die 130 is illustrated in FIG. 5, the embodiments of the present invention are not limited thereto. In alternative embodiments, one or more dies are disposed on the RDL structure 110 between the TIVs 120.

In detail, the die 130 may have a front side (or an active surface) 130a and a backside (or a non-active surface) 130b opposite to each other. The backside 130b of the die 130 is toward the carrier 100, while the front side 130a of the die 130 is toward upside and away from the carrier 100. Specifically, the die 130 include a substrate 132, a plurality of contacts 134 and a passivation layer 136.

In some embodiments, the substrate 132 may be made of silicon or other semiconductor materials. For example, the substrate 132 may be a silicon substrate. Alternatively, or additionally, the substrate 132 may include other elementary semiconductor materials such as germanium. In some embodiments, the substrate 132 is made of a compound semiconductor such as silicon carbide, gallium arsenic, indium arsenide or indium phosphide. In some embodiments, the substrate 132 is made of an alloy semiconductor such as silicon germanium, silicon germanium carbide, gallium arsenic phosphide, or gallium indium phosphide. Furthermore, the substrate 132 may be a semiconductor on insulator such as silicon on insulator (SOI) or silicon on sapphire.

The contacts 134 are formed on the substrate 132 and electrically connected to the semiconductor devices (not shown) in and/or on the substrate 132. In some embodiments, the contacts 134 may include solder bumps, gold bumps, copper bumps, copper posts, or the like. The term "copper posts" refers to copper protrusions, copper through vias, thick copper pads, and/or copper-containing protrusions. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The contacts 134 are formed by physical vapor deposition (PVD) or electroplating, for example. In some alternative embodiments, the contact 134 may include connection pads, such as aluminum pad, for example.

In addition, an interconnect structure (not shown) may be formed between the substrate 132 and the contacts 134. The interconnect structure may interconnect the semiconductor devices in and/or on the substrate 132, so as to form an integrated circuit. The interconnect structure may be formed by, for example, metallization patterns in dielectric layers. The metallization patterns include metal lines and vias formed in one or more low-k dielectric layers.

The passivation layer 136 is formed to laterally surround the contacts 134. In some embodiments, the passivation layer 136 includes silicon oxide, silicon nitride, benzocyclobutene (BCB) polymer, polyimide (PI), polybenzoxazole (PBO) or a combination thereof and is formed by a suitable process such as spin coating, CVD or the like. In an embodiment, the passivation layer 136 may be a single-layered structure, a bi-layered structure, or a multi-layered structure.

Figure 6:
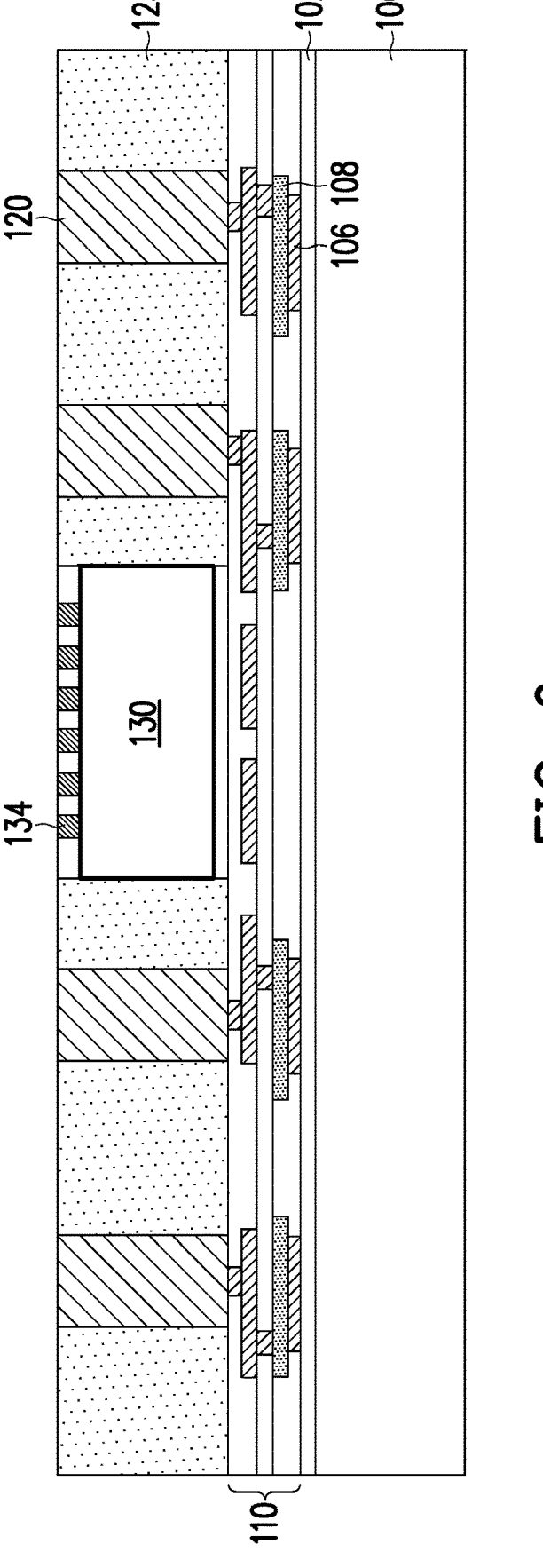

Referring to FIG. 6, an encapsulant 125 is then formed to laterally encapsulate the die 130 and the TIVs 120. In some embodiments, the encapsulant 125 includes an epoxy, an organic polymer, a polymer with or without a silica-based or glass filler added, or other materials, as examples. In some embodiments, the encapsulant 125 includes a liquid molding compound (LMC) that is a gel type liquid when applied. The encapsulant 125 may also include a liquid or solid when applied. Alternatively, the encapsulant 125 may include other insulating and/or encapsulating materials.

In some embodiments, the encapsulant 125 is formed by using a wafer level molding process, such as a compressive molding process, a transfer molding process, or other processes. Next, a material of the encapsulant 125 is cured by using a curing process, in some embodiments. The curing process may include heating the material of the encapsulant 125 to a predetermined temperature for a predetermined period of time, using an anneal process or other heating process. The curing process may also include an ultra-violet (UV) light exposure process, an infrared (IR) energy exposure process, combinations thereof, or a combination thereof with a heating process. Alternatively, the material of the encapsulant 125 may be cured by using other methods. In some alternative embodiments, a curing process is not included.

After the curing process, a planarization process, such as a chemical mechanical polish (CMP) process, may be performed to remove excess portions of the encapsulant 125 over the front side 130a of the die 130. After the planarization process, the encapsulant 125, the contacts 134, the passivation layers 136, and the TIVs 120 have a coplanar upper surface, in some embodiments. In some alternative embodiments, the planarization process is omitted.

Figure 7:
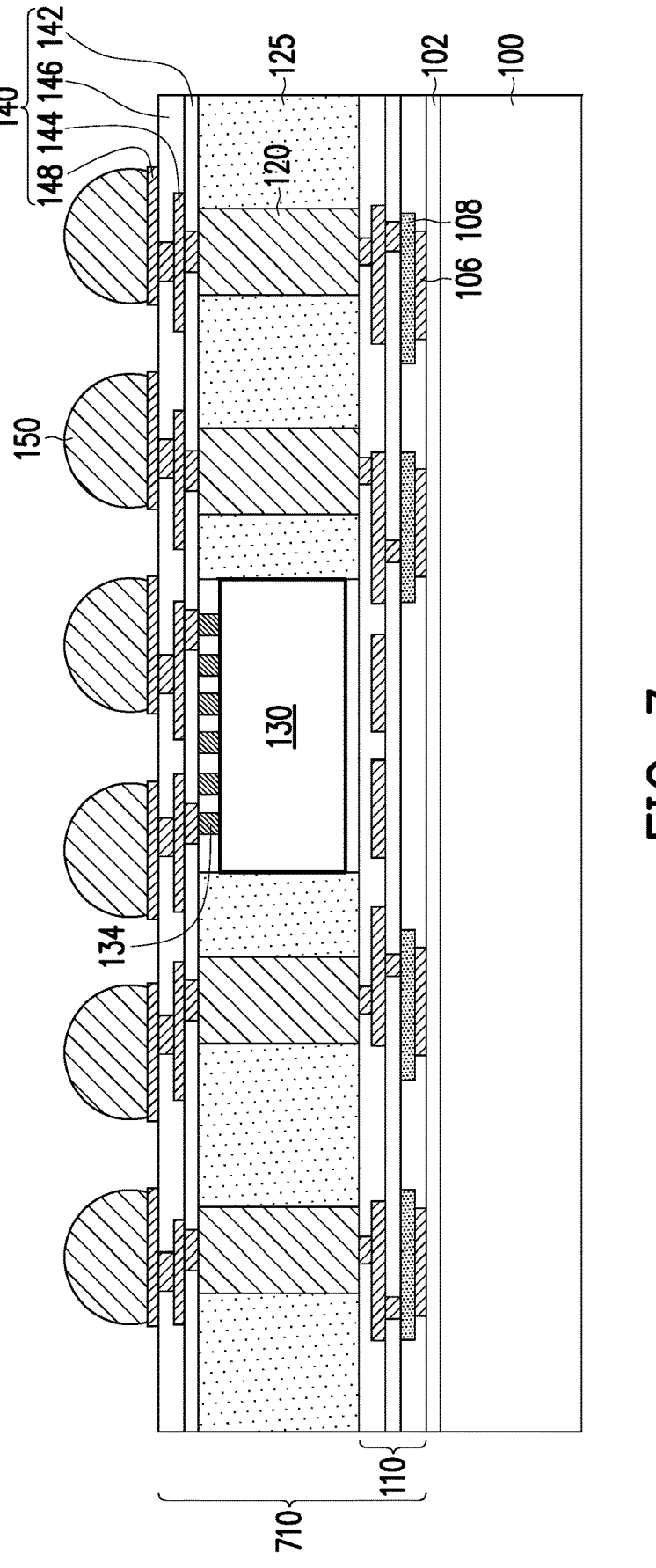

Referring to FIG. 7, a redistribution layer (RDL) structure 140 is formed on the front side 130a of the die 130, the encapsulant 125, and the TIVs 120, thereby accomplishing the first package component 710. In some embodiments, the RDL structure 140 includes a plurality of dielectric layers 142, 146 and a plurality of redistribution layers 144, 148 stacked alternately. The number of the dielectric layers or the redistribution layers is not limited by the disclosure.

In some embodiments, the redistribution layer 144 penetrates through the dielectric layer 142 and is electrically connected to the TIVs and/or the contacts 134 of the die 130. The redistribution layer 148 penetrates through the dielectric layer 146 and is electrically connected to the redistribution layer 144. In some embodiments, the dielectric layers 142 and 146 include a photo-sensitive material such as polybenzoxazole (PBO), polyimide (PI), benzocyclobutene (BCB), a combination thereof or the like. In some embodiments, the redistribution layers 144 and 148 include conductive materials. The conductive materials include metal such as copper, nickel, titanium, a combination thereof or the like, and are formed by an electroplating process. In some embodiments, the redistribution layers 144 and 148 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers 144 and 148 respectively includes a plurality of vias and a plurality of traces connected to each other. The vias penetrate through the dielectric layers 142 and 146 and connect to the traces, and the traces are respectively located on the dielectric layers 142 and 146, and are respectively extending on the top surfaces of the dielectric layers 142 and 146. In some embodiments, the topmost redistribution layer 148 is also referred as under-ball metallurgy (UBM) layer for ball mounting.

Thereafter, a plurality of conductive terminals 150 are formed on and electrically connected to the redistribution layer 148 of the redistribution layer structure 140. In some embodiments, the conductive terminals 150 are made of a conductive material with low resistivity, such as Sn, Pb, Ag, Cu, Ni, Bi or an alloy thereof, and are formed by a suitable process such as evaporation, plating, ball drop, screen printing, or a ball mounting process. The conductive terminals 150 are electrically connected to the die 130 through the RDL structure 140 and the contacts 134.

The conductive terminals 150 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The conductive terminals 150 may include a conductive material such as solder, copper, aluminum, gold, nickel, silver, palladium, tin, the like, or a combination thereof. In some embodiments, the conductive terminals 150 comprise a eutectic material and may comprise a solder bump or a solder ball, as examples. The conductive terminals 150 may form a grid, such as a ball grid array (BGA). The conductive terminals 150 may be formed using any suitable process. Although the conductive terminals 150 are illustrated in FIG. 7 as having a partial sphere shape, the conductive terminals 150 may comprise other shapes. For example, the conductive terminals 150 may also comprise non-spherical conductive connectors.

In some embodiments, the conductive terminals 150 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Figure 8:
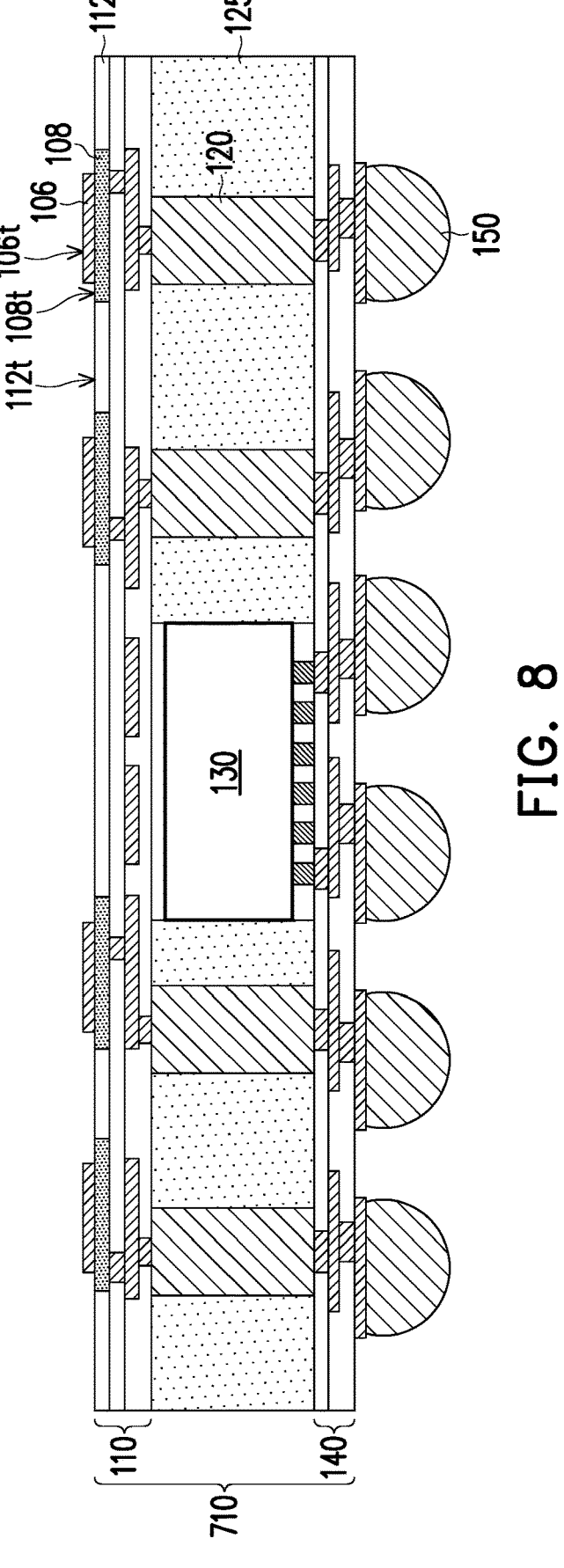

Referring to FIG. 7 and FIG. 8, the structure of FIG. 7 is turned upside down, and then the carrier 100 is released from the first package component 710. In some embodiments, the carrier 100 is de-bonded from the first package component 710 via a suitable process, such as etching, grinding, or mechanical peel off. In an embodiment where the de-bonding layer 102 is an LTHC film, the carrier 100 is de-bonded by exposing the carrier 100 to a laser or UV light. The laser or UV light breaks the chemical bonds of the LTHC film that binds to the carrier 100, and the carrier 100 can then be easily detached. The de-bonding layer 102 (e.g., an LTHC film) is also removed after the carrier de-bonding process, in some embodiments. After the de-bonding the carrier 100, a cleaning process is performed to remove the remaining de-bonding layer 102. The cleaning process is a dry etch process, such as a plasma process, in some embodiments. In some embodiments, the cleaning process is a wet etch process.

After the cleaning process, a top surface 106t of the metal layer 106 is exposed. In some embodiments, the oxidation ability of the metal layer 106 (e.g., Cu layer) is lower than that of the barrier layer 108 (e.g., Ni layer) and the oxide of metal layer 106 (e.g., copper oxide) cam be removed by a cleaning step before ball mounting. Therefore, by forming the metal layer 106 on the barrier layer 108, the resistance can be reduced and the process window can be increased. Next, a second etching process is performed to remove a portion of the dielectric layer 112, thereby exposing a portion of the top surface 108t of the barrier layer 108, as shown in FIG. 8. In some embodiments, the second etching process is used to remove the dielectric layer 112, but not remove the metal layer 106 and the barrier layer 108. In other words, the first etching process provides a high etching selectivity of the dielectric layer 112 relative to the metal layer 106 and the barrier layer 108. That is, the etching rate of the dielectric layer 112 is greater than the etching rate of the metal layer 106 and the barrier layer 108 during the second etching process. In some embodiments, the second etching process includes a dry etching process (e.g., Reactive-Ion Etching (RIE) process) containing $CF_4$, $O_2$, Ar, $N_2$, or a combination thereof. Although the top surface 112t of the dielectric layer 112 illustrated in FIG. 8 is substantially level with the top surface 108t of the barrier layer 108, the embodiments of the present invention are not limited thereto. In other embodiments, the top surface 112t of the dielectric layer 112 may be lower than the top surface 108t of the barrier layer 108.

Figure 9:
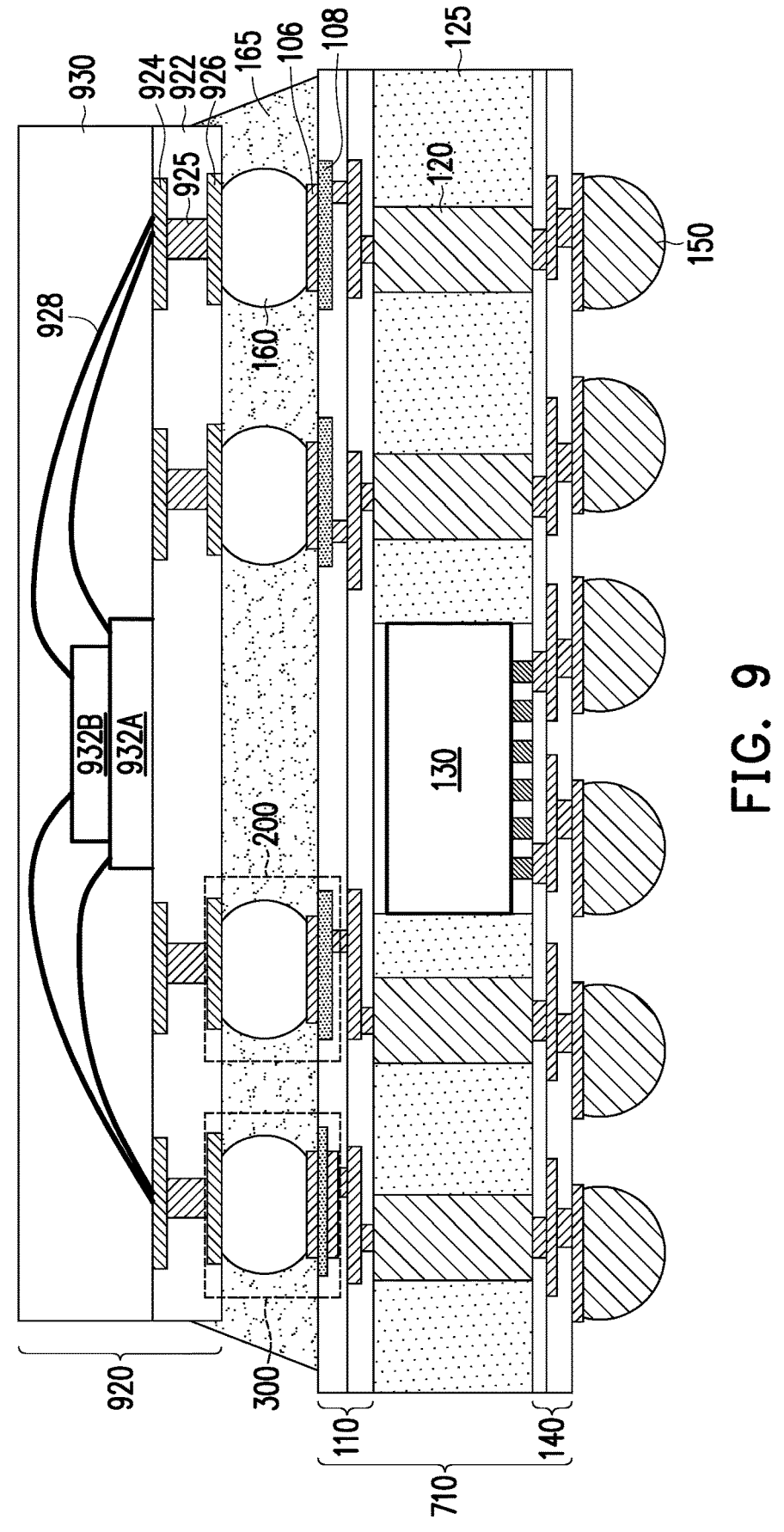

Referring to FIG. 9, a second package component 920 is bonded onto the first package component 710 through a solder layer 160. In some embodiments, the solder layer 160 includes a plurality of conductive connectors, such as solder balls. In detail, the second package component 920 may include, for example, a substrate 922 and one or more stacked dies 932A and 932B coupled to the substrate 922. Although one set of stacked dies 932A and 932B is illustrated, in other embodiments, a plurality of sets of stacked dies may be disposed side-by-side coupled to a same surface of the substrate 922. The substrate 922 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 922 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 922 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 922.

The substrate 922 may include active and passive devices (not shown). A wide variety of devices such as transistors, capacitors, resistors, combinations of these, and the like may be used to generate the structural and functional requirements of the design for the second package components 920. The devices may be formed using any suitable methods.

The substrate 922 may also include metallization layers (not shown) and the conductive vias 925. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 922 is substantially free of active and passive devices.

The substrate 922 may have bond pads 924 on a first side of the substrate 922 to couple to the stacked dies 932A, 932B, and bond pads 926 on a second side of the substrate 922, the second side being opposite the first side of the substrate 922, to couple to the conductive connectors 924. In some embodiments, the bond pads 924 and 926 are formed by forming recesses (not shown) into dielectric layers (not shown) on the first and second sides of the substrate 922. The recesses may be formed to allow the bond pads 924 and 926 to be embedded into the dielectric layers. In other embodiments, the recesses are omitted as the bond pads 924 and 926 may be formed on the dielectric layer. In some embodiments, the bond pads 924 and 926 include a thin seed layer (not shown) made of copper, titanium, nickel, gold, palladium, the like, or a combination thereof. The conductive material of the bond pads 924 and 926 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 924 and 926 is copper, tungsten, aluminum, silver, gold, the like, or a combination thereof.

In some embodiments, the bond pads 924 and the bond pads 926 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 924 and 926. Any suitable materials or layers of material that may be used for the bond pads 924 and 926 are fully intended to be included within the scope of the current application. In some embodiments, the conductive vias 925 extend through the substrate 922 and couple at least one of the bond pads 924 to at least one of the bond pads 926.

In the illustrated embodiment, the stacked dies 932A and 932B are coupled to the substrate 922 by wire bonds 928 although other connections may be used, such as conductive bumps. In an embodiment, the stacked dies 932A and 932B are stacked memory dies. For example, the stacked dies 932A and 932B may be memory dies such as low-power (LP) double data rate (DDR) memory modules, such as LPDDR1, LPDDR2, LPDDR3, LPDDR4, or the like memory modules.

The stacked dies 932A and 932B and the wire bonds 928 may be encapsulated by a molding material 930. The molding material 930 may be molded on the stacked dies 932A, 932B and the wire bonds 928, for example, using compression molding. In some embodiments, the molding material 930 is a molding compound, a polymer, an epoxy, silicon oxide filler material, the like, or a combination thereof. A curing process may be performed to cure the molding material 930; the curing process may be a thermal curing, a UV curing, the like, or a combination thereof.

In some embodiments, the stacked dies 932A, 932B and the wire bonds 928 are buried in the molding material 930, and after the curing of the molding material 930, a planarization step, such as a grinding, is performed to remove excess portions of the molding material 930 and provide a substantially planar surface for the second package components 920.

After the second package components 920 are formed, the second package components 920 are mechanically and electrically bonded to the first package component 710 by the solder layer 160. In some embodiments, the stacked dies 932A and 932B may be coupled to the die 130 through the wire bonds 928, the bond pads 924 and 926, the conductive vias 925, the solder layer 160, the second RDL structure 110, the TIVs 120, and the RDL structure 140. Further, an underfill layer 165 is formed to laterally encapsulate the solder layer 160 and the second package components 920, thereby reducing stress and protecting the joints resulting from the reflowing of the solder layer 160. In some embodiments, the underfill layer 165 may be any acceptable material, such as a polymer, epoxy, molding underfill, or the like. The underfill layer 165 may have a curved sidewall. In some embodiments, an area within an outermost perimeter of the first package component 710 is greater than an outermost perimeter of the second package components 920 in a plan view.

FIG. 10A to FIG. 10D are enlarged views of a joint structure of FIG. 9 in accordance with various embodiments.

Figure 10A:
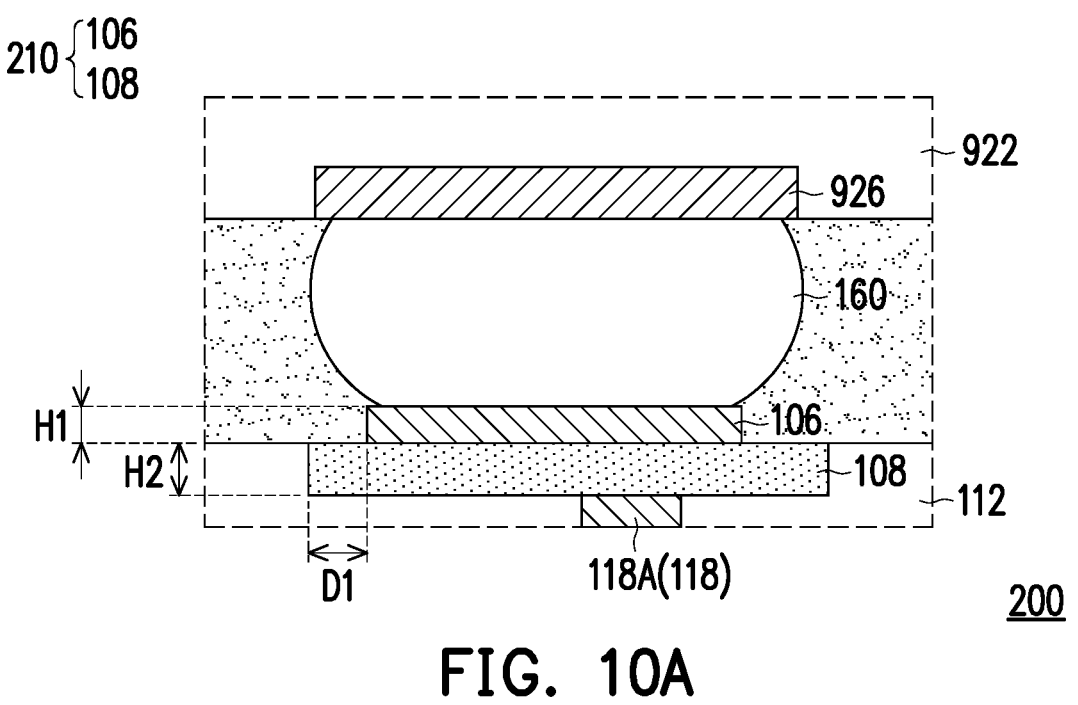
FIG. 10A to FIG. 10D are enlarged views of a joint structure of FIG. 9 in accordance with various embodiments.

Referring to FIG. 10A, a joint structure 200 may include a first under bump metallurgy (UBM) structure 210, the solder layer 160, and the bond pad 926. In some embodiments, the first UBM structure 210 includes the barrier layer 108 embedded in the dielectric layer 112 and the metal layer 106 on the barrier layer 108. The metal layer 106 may have a first height H1 in a vertical direction, and the barrier layer 108 may have a second height H2 in the vertical direction. In some embodiments, the first height H1 is in a range from about 0.5 μm to about 20 μm such as 5 μm; and the second height H2 is in a range from about 0.5 μm to about 20 μm such as 3 μm. It should be noted that, in some embodiments, the sidewall of the barrier layer 108 is laterally offset outward from the sidewall of the metal layer 106. That is, the barrier layer 108 has the lateral width greater than the lateral width of the metal layer 106, so that the non-zero distance D1 is included between the sidewall of the barrier layer 108 and the sidewall of the metal layer 106. In some embodiments, the non-zero distance D1 is in a range from about 0.5 μm to about 20 μm, such as 2 μm. If the D1 is less than 0.5 μm, the solder layer 160 may flow downward to directly contact the underlying conductive via 118A of the redistribution layer 118. In this case, the solder layer 160 and the conductive via 118A may migrate and react with each other to form intermetallic compound (IMC) at the interface between the conductive via 118A and the dielectric layer 112. Since the poor adhesion is included between the IMC and the dielectric layer 112, the delamination issue of the dielectric layer 112 occurs, which further leads to the crack issue of the conductive via 118A (i.e., Cu crack). In order to solve the said issues, the wider barrier layer 108 of the present embodiment is used as a dam structure to prevent the solder layer 160 from contacting the underlying redistribution layer 118 and the dielectric layer 112. As such, the dielectric delamination issue is avoided, thereby enhancing the reliability and yield of the joint structure 200 of the package structure. On the other hand, if the D1 is greater than 20 the occupied area of the barrier layer 108 in the RDL structure 110 is too large, thereby affecting the design of the metal routing.

Figure 10B:
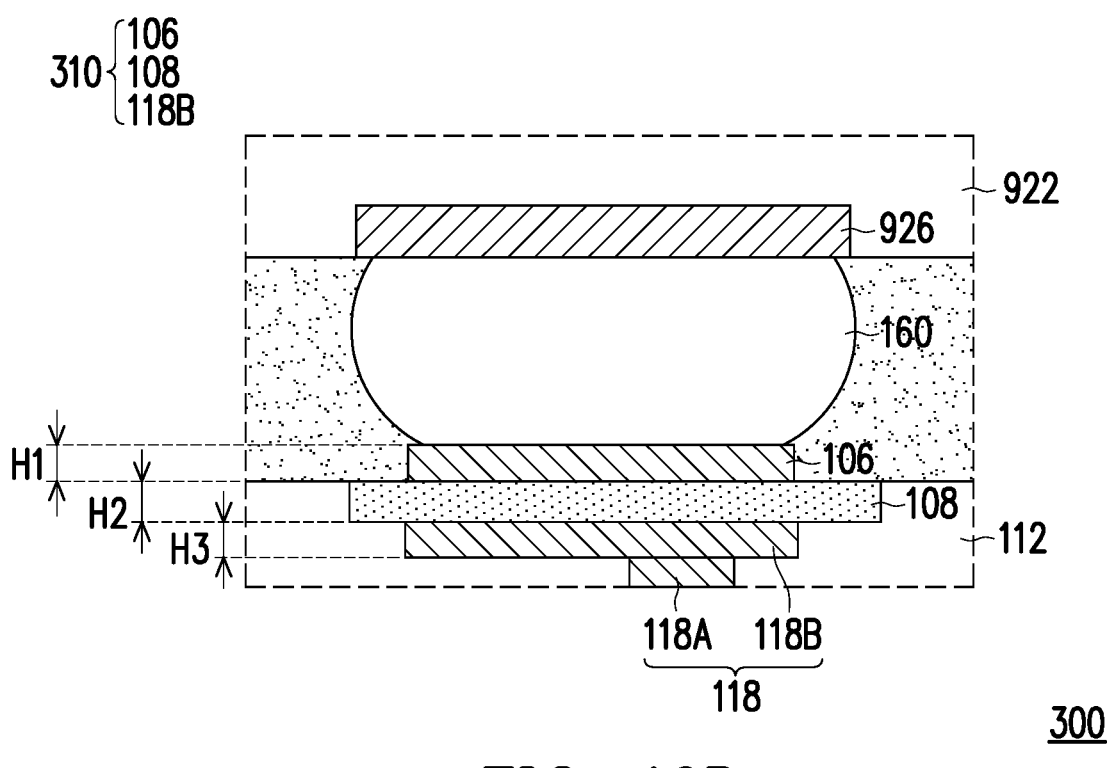

Referring to FIG. 10B, a joint structure 300 may include a first UBM structure 310, the solder layer 160, and the bond pad 926. In some embodiments, the first UBM structure 310 includes a trace 118B (hereinafter called lower metal layer 118B) embedded in the dielectric layer 112, the barrier layer 108 embedded in the dielectric layer 112, and the metal layer 106 (hereinafter called upper metal layer 106) on the barrier layer 108. The upper metal layer 106 may have a first height H1 in a vertical direction, the barrier layer 108 may have a second height H2 in the vertical direction, and the lower metal layer 118B may have a third height H3 in the vertical direction. In some embodiments, the first height H1 is in a range from about 0.5 µm to about 20 µm such as 5 µm; the second height H2 is in a range from about 0.5 µm to about 20 µm such as 3 µm; and the third height H3 is in a range from about 0.5 µm to about 20 µm such as 3 µm. It should be noted that, in some embodiments, the sidewall of the barrier layer 108 is laterally offset outward from the sidewall of the metal layers 106 and 118B. That is, the barrier layer 108 has the lateral width greater than the lateral width of the metal layers 106 and 118B. In some embodiments, the material of the barrier layer 108 is different from the material of the metal layers 106 and 118B. More specifically, the barrier layer 108 is configured to have a metal material that is more difficult to form an intermetallic compound (IMC) with the solder layer 160 than the metal layers 106 and 118B. For example, the metal layers 106 and 118B is copper (Cu) layers, and the barrier layer 108 is a nickel (Ni) layer. In such embodiment, the barrier layer 108 is able to prevent the solder layer 160 from contacting the underlying metal line 118B and the dielectric layer 112. As such, the dielectric delamination issue is avoided, thereby enhancing the reliability and yield of the joint structure 300 of the package structure.

In some alternative embodiments, an IMC layer is formed between the solder layer 160 and the upper metal layer 106. The material (such as Sn) of the solder layer 160 and the material (such as Cu) of the upper metal layer 106 may migrate and react with each other to form the IMC layer (not shown). The IMC layer may be referred to as an intermetallic alloy, an ordered intermetallic alloy, or a long-range-ordered alloy. The IMC layer is a solid-state compound containing two or more metallic elements, and exhibits metallic bonding and ordered crystal structure. In some embodiments, the IMC layer include $Cu_6Sn_5$ or another suitable material. The IMC layer may be blocked by the extended barrier layer 108, so that the IMC layer is not in direct contact with the dielectric layer 112, thereby avoiding the dielectric delamination issue.

Figure 10C:
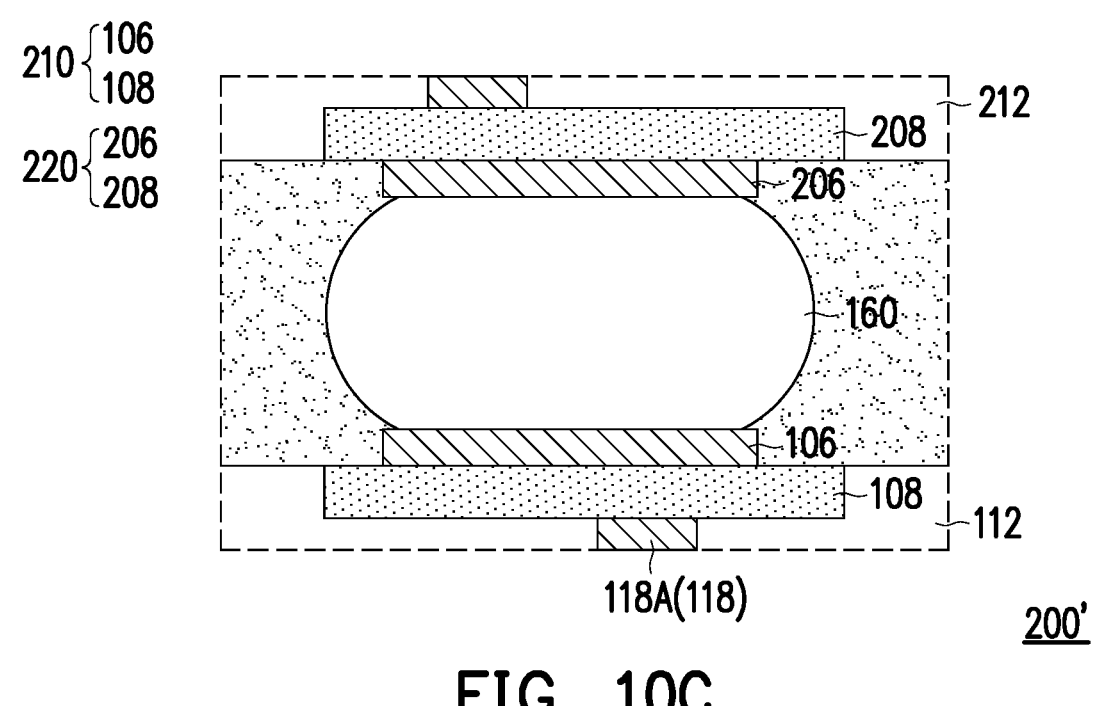

Referring to FIG. 10C, a joint structure 200' is similar to the joint structure 200 of FIG. 10A, but the bond pad 926 of the joint structure 200 is replaced by a second UBM structure 220. Specifically, the joint structure 200' may include the solder layer 160 sandwiched between the first UBM structure 210 and the second UBM structure 220. In some embodiments, the first UBM structure 210 includes the barrier layer 108 embedded in the dielectric layer 112 and the metal layer 106 on the barrier layer 108. The second UBM structure 220 may include a barrier layer 208 embedded in a dielectric layer 212 and a metal layer 206 on the barrier layer 208. The solder layer 160 is sandwiched between and in contact with the metal layer 106 and the metal layer 206. The material and forming method of the metal layer 206 and the barrier layer 208 are similar to the material and forming method of the metal layer 106 and the barrier layer 108 and have been described in detail in the above embodiments. Thus, details thereof are omitted here. It should be noted that, in some embodiments, the barrier layers 108 and 208 are used as a dam structure to prevent the solder layer 160 from contacting the dielectric layers 112 and 212. As such, the dielectric delamination issue is avoided, thereby enhancing the reliability and yield of the joint structure 200' of the package structure.

Figure 10D:
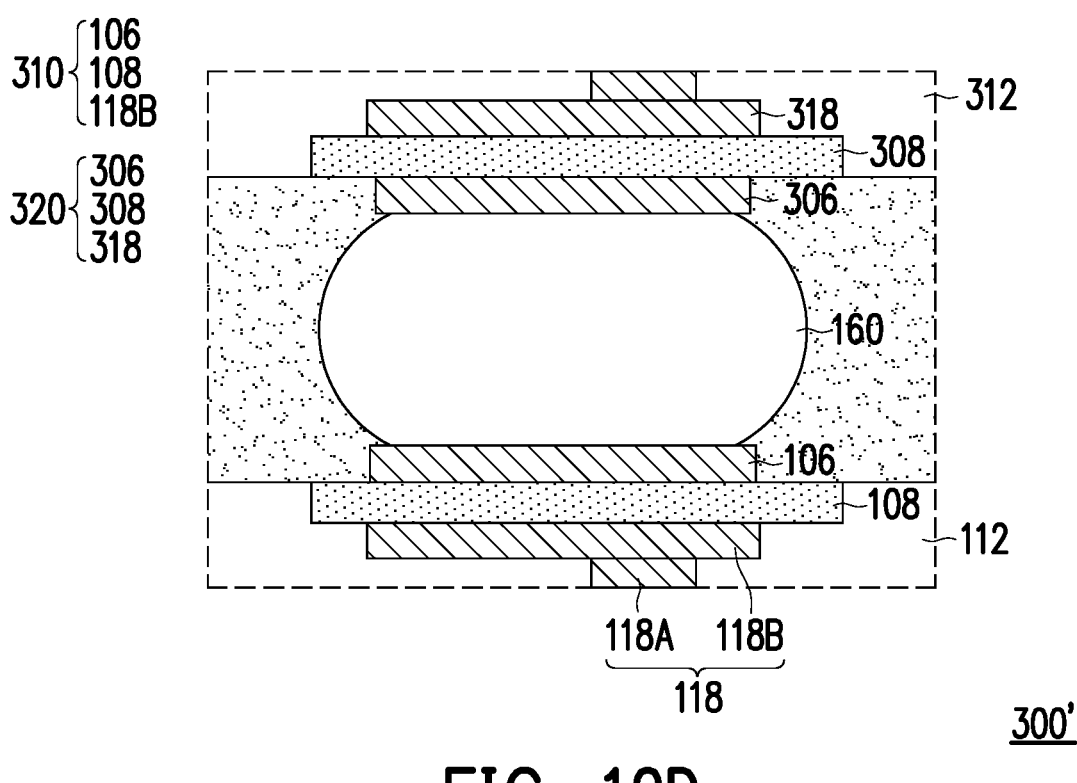

Referring to FIG. 10D, a joint structure 300' is similar to the joint structure 300 of FIG. 10B, but the bond pad 926 of the joint structure 300 is replaced by a second UBM structure 320. Specifically, the joint structure 300' may include the solder layer 160 sandwiched between the first UBM structure 310 and the second UBM structure 320. In some embodiments, the first UBM structure 310 includes the lower metal layer 118B embedded in the dielectric layer 112, the barrier layer 108 embedded in the dielectric layer 112, and the upper metal layer 106 on the barrier layer 108. The second UBM structure 320 may include a first metal layer 318 embedded in the dielectric layer 312, the barrier layer 308 embedded in the dielectric layer 312, and the second metal layer 306 on the barrier layer 308. The solder layer 160 is sandwiched between and in contact with the first metal layer 318 and the second metal layer 306. The material and forming method of the metal layers 306, 318 and the barrier layer 308 are similar to the material and forming method of the metal layer 106 and the barrier layer 108 and have been described in detail in the above embodiments. Thus, details thereof are omitted here. It should be noted that, in some embodiments, the barrier layers 108 and 308 are used as a dam structure to prevent the solder layer 160 from contacting the dielectric layers 112 and 312. As such, the dielectric delamination issue is avoided, thereby enhancing the reliability and yield of the joint structure 300' of the package structure.

Figure 11A:
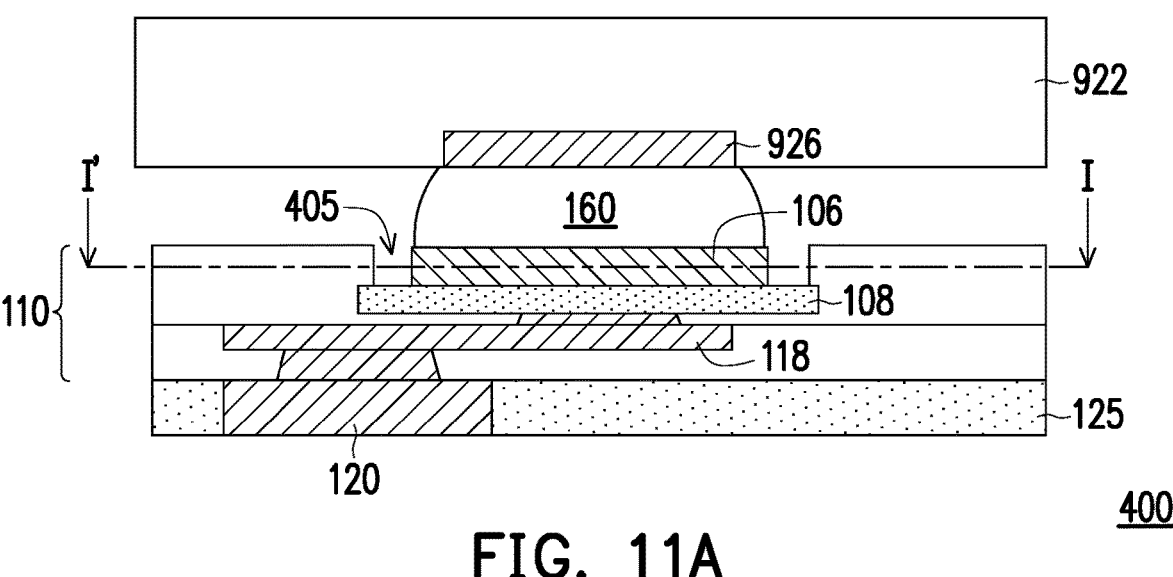
FIG. 11A is a cross-sectional view of a joint structure in accordance with some alternative embodiments.
Figure 11B:
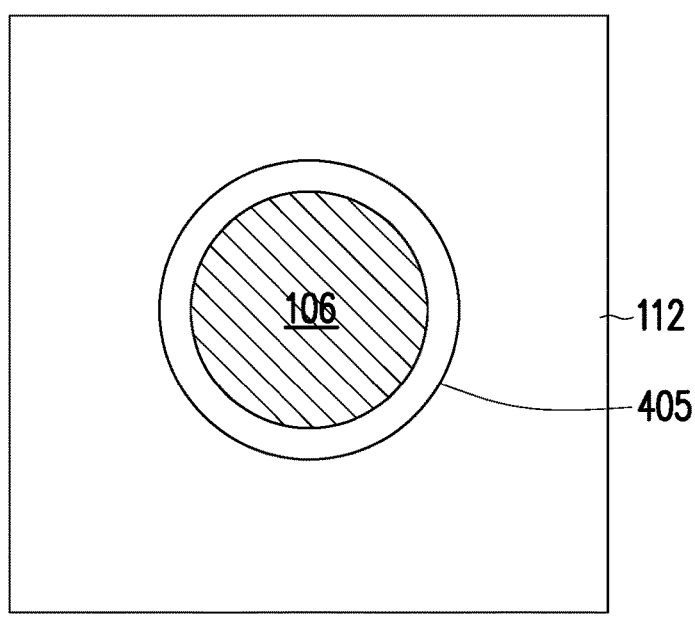
FIG. 11B is a top view of the metal layer and the dielectric layer taken along I-I' line of FIG. 11A in accordance with some alternative embodiments.

FIG. 11A is a cross-sectional view of a joint structure in accordance with some alternative embodiments. FIG. 11B is a top view of the metal layer and the dielectric layer taken along I-I' line of FIG. 11A in accordance with some alternative embodiments.

Referring to FIG. 11A and FIG. 11B, a joint structure 400 is similar to the joint structure 200 of FIG. 10A, but the joint structure 400 further includes an opening 405 disposed in the dielectric layer 112 and laterally surrounding the metal layer 106 and the solder layer 160. In detail, the opening 405 may extend from the top surface of the dielectric layer 112 to the top surface of the barrier layer 108, thereby exposing a portion of the top surface of the barrier layer 108. In some embodiments, the opening 405 is formed by performing a laser drilling process to remove a portion of the dielectric layer 112 until exposing the barrier layer 108. As shown in the top view of FIG. 11B, the metal layer 106 is a circle, and the opening 405 is an annular opening laterally surrounding the metal layer 106. However, the embodiments of the present invention are not limited thereto. In some embodiments, the metal layer 106 in the top view includes oval, square, rectangle, diamond, polygon shape, or any acceptable shape. It should be noted that, in some embodiments, the opening 405 can accommodate the excess solder layer 160 and the barrier layer 108 can avoid the solder layer 160 flowing downward and directly contacting the underlying redistribution layer 118. In this case, the undesired IMC is not formed at the interface between the redistribution layer 118 and the dielectric layer 112 to avoid the dielectric delamination issue, thereby enhancing the reliability and yield of the joint structure 400 of the package structure.

Moreover, although the said embodiment uses the PoP structure as an example to illustrate the packaging structure with the joint structure 200, 200', 300, 300', or 400, the embodiments of the present invention are not limited thereto. In other embodiments, the joint structure 200, 200', 300, 300', or 400 may be applied to any suitable package structure, such as chip on wafer on substrate (CoWoS) package structure, integrated fan-out (InFO) package structure, system on integrated chip (SoIC) package structure, or the like.

Figure 12:
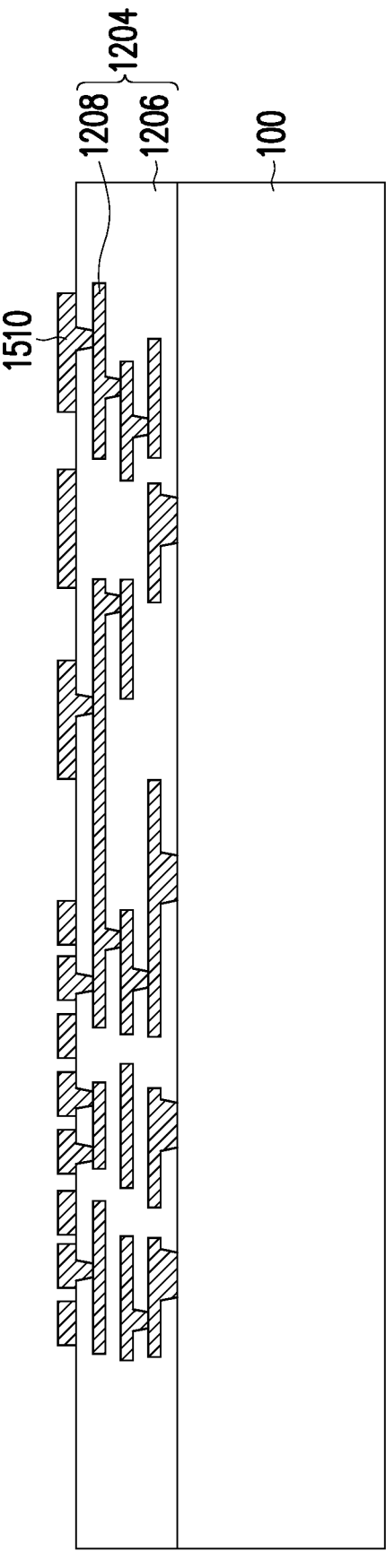
FIG. 12 to FIG. 14 are cross-sectional views of a method of forming package structure in accordance with some other embodiments.
Figure 13:
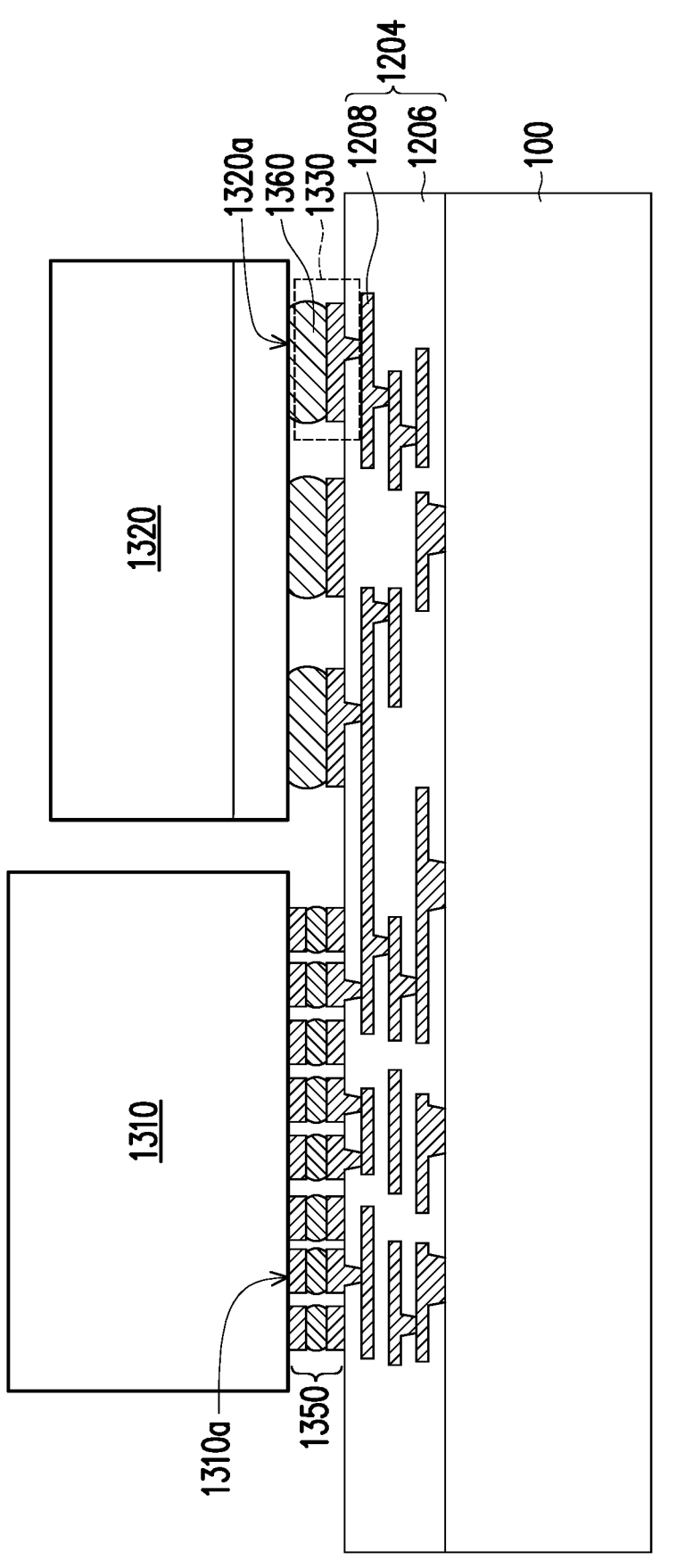
Figure 14:
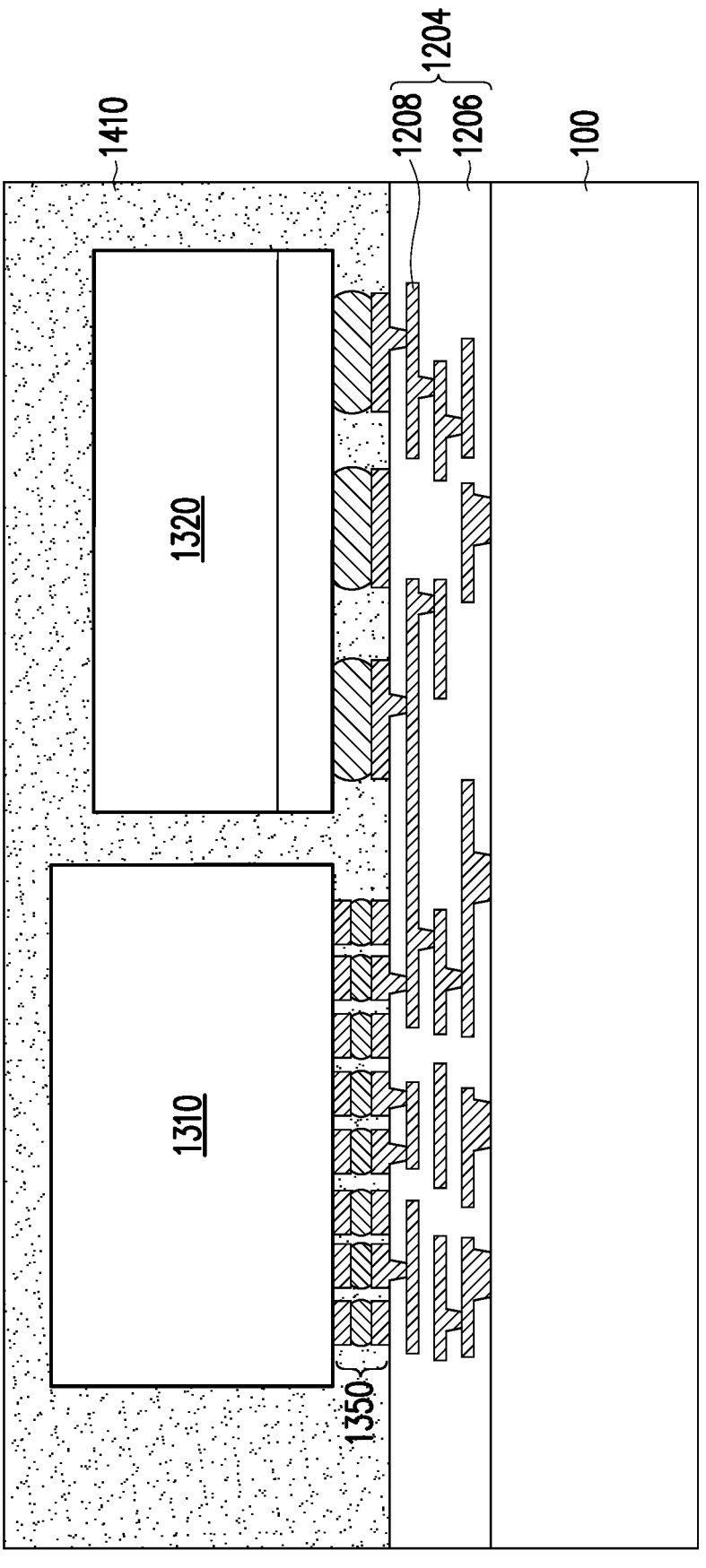
Figure 15:
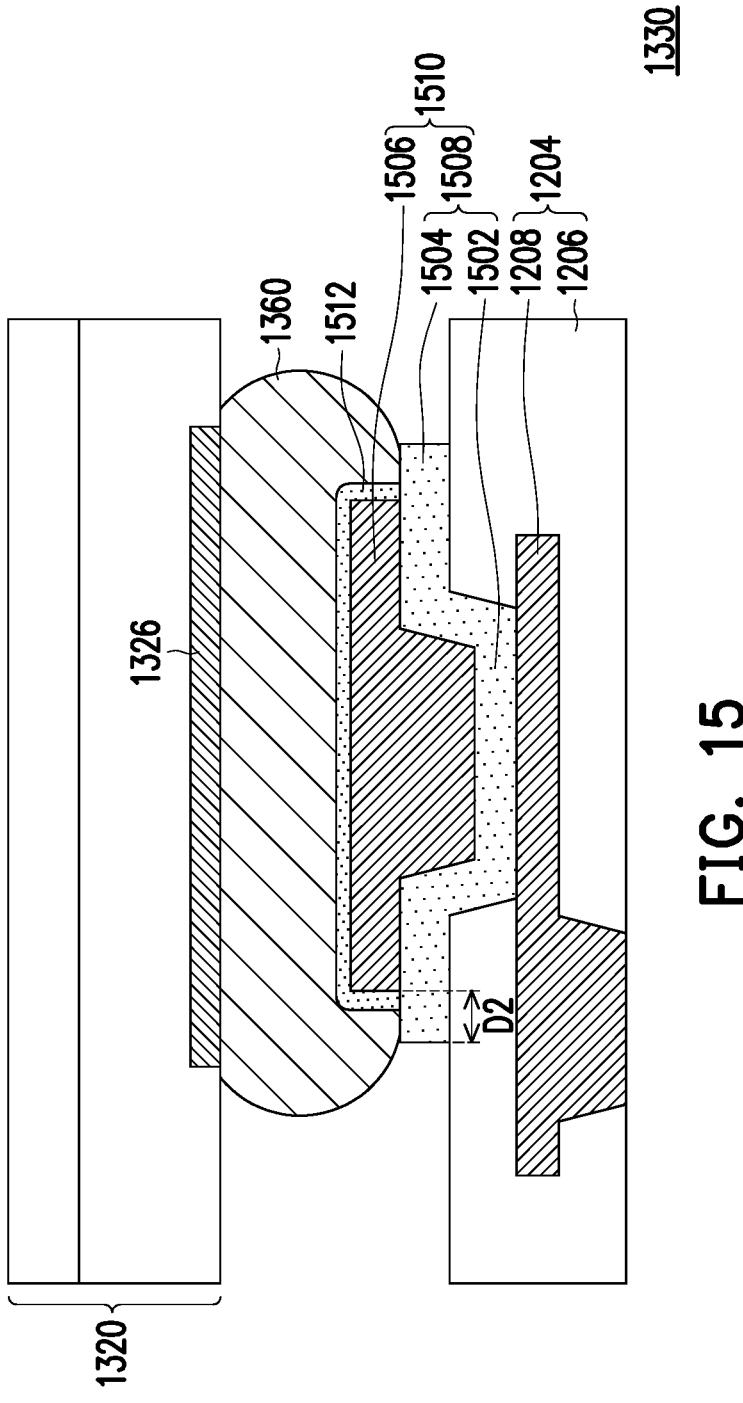
FIG. 15 and FIG. 16 are enlarged views of a joint structure of FIG. 13 in accordance with various embodiments.
Figure 16:
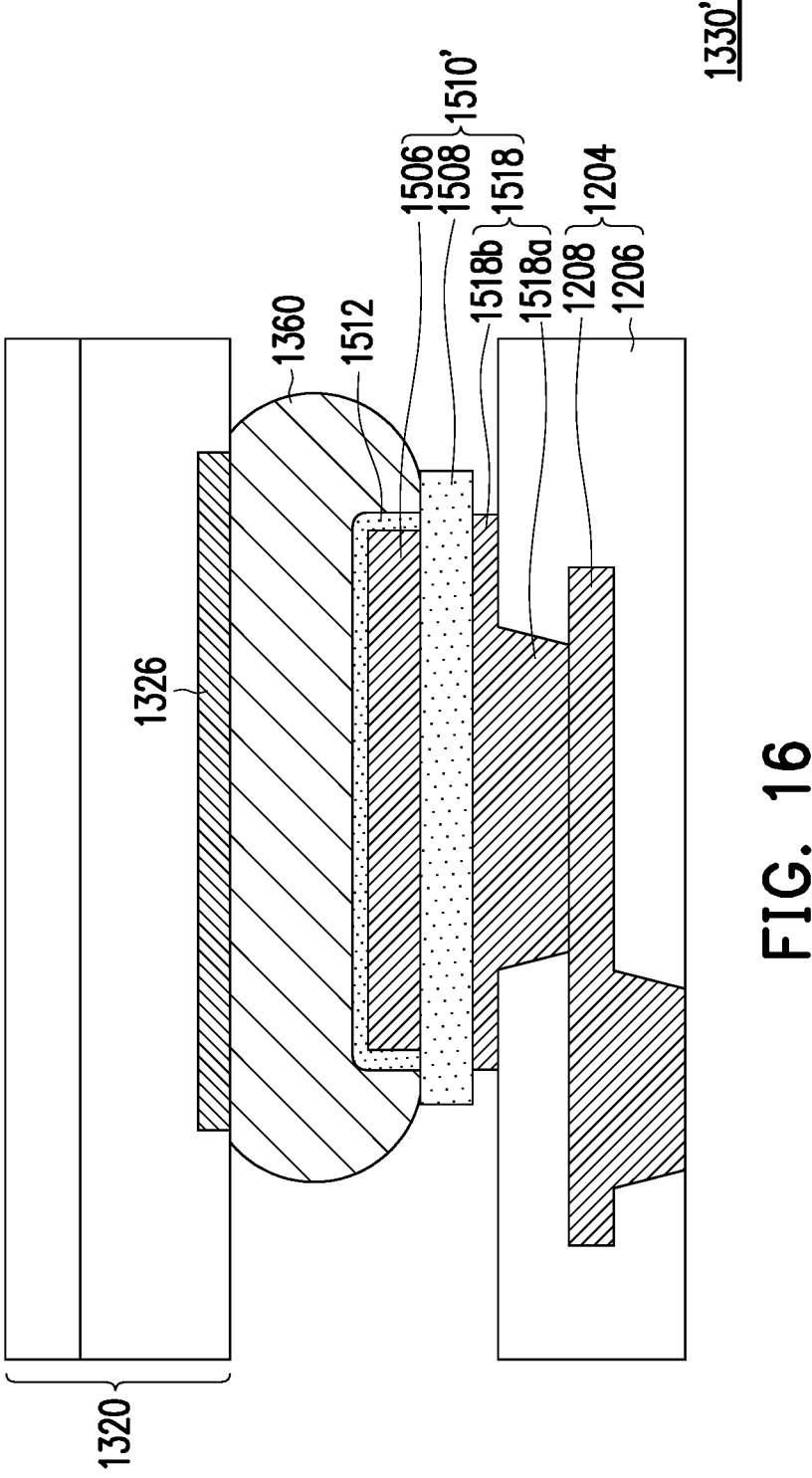

FIG. 12 to FIG. 14 are cross-sectional views of a method of forming package structure in accordance with some other embodiments. FIG. 15 and FIG. 16 are enlarged views of a joint structure of FIG. 13 in accordance with various embodiments.

Referring to FIG. 12, a carrier 100 is provided. In some embodiments, the carrier 100 may be a glass carrier or any suitable carrier for the manufacturing method of the package structure. A RDL structure 1204 is then formed on the carrier 100. In detail, the RDL structure 1204 includes a dielectric layer 1206 and a plurality of redistribution layers 1208. The redistribution layers 1208 are formed in the dielectric layer 1206 and electrically connected with each other. In some embodiments, the dielectric layer 1206 is referred to as a polymer layer which includes a photo-sensitive material such as polybenzoxazole (PBO), polyimide (PI), benzocyclobutene (BCB), a combination thereof or the like. In some embodiments, the redistribution layers 1208 include a conductive material. The conductive material may include metal such as copper, nickel, titanium, a combination thereof or the like, and are formed by an electroplating process. In some embodiments, one of the redistribution layers 1208 includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers 1208 include a plurality of vias and a plurality of traces connected to each other. Although the dielectric layer 1206 illustrated in FIG. 12 is a single-layered structure, the embodiments of the present disclosure are not limited thereto. In other embodiments, the dielectric layer 1206 may be a bi-layered structure or multi-layered structure. In some embodiments, the topmost redistribution layer 1510 is also referred as under-ball metallurgy (UBM) structure for ball mounting, the configuration of the UBM structure will be detailed in the following paragraphs.

Referring to FIG. 13, a first die 1310 and a second die 1320 are mounted onto the RDL structure 1204 side by side. In detail, the first die 1310 and the second die 1320 are bonded onto the RDL structure 1204 in a flip-chip bonding. That is, the first die 1310 and the second die 1320 are upside down, so that a front side 1310a of the first die 1310 faces toward the RDL structure 1204 and a front side 1320a of the second die 1320 also faces toward the RDL structure 1204. The first die 1310 may be bonded onto the RDL structure 1204 through a plurality of connectors 1350. In some embodiment, the connectors 1350 are micro-bumps containing solder caps sandwiched between two copper posts, but the embodiments of the present invention are not limited thereto. In other embodiments, the connectors 1350 include solder bumps, gold bumps or other available metallic bumps. The second die 1320 may be bonded onto the RDL structure 1204 through a solder layer 1260. In some embodiments, the solder layer 1260 includes a plurality of conductive connectors, such as solder balls.

In some embodiments, the first die 1310 include system on a chips or system on chips (SoC) including several different integrated circuits, i.e., ICs or processors, together with memories and I/O interfaces. Each of the integrated circuit integrates various components of a computer or other electronic systems into one semiconductor chip. The various components contain digital, analog, mixed-signal, and often radio-frequency functions. Also, the SoC integrates processors (or controllers) with advanced peripherals like a graphics processing unit (GPU), a Wi-Fi module, or a co-processor. In the architecture of the SoC, both logic components and memory components are fabricated in the same silicon wafer. For high efficiency computing or mobile devices, multi-core processors are used, and the multi-core processors include large amounts of memories, such as several gigabytes. In some alternative embodiments, the first die 1310 may be application-specific integrated circuit (ASIC) dies. In some other embodiments, the first die 1310 are logic dies.

In the present embodiments, the first die 1310 and the second die 1320 may have different types of dies. For example, the first die 1310 is a SoC die, while the second die 1320 a package, such as a memory package. In some embodiments, the memory package may include memory dies, such as dynamic random-access memory (DRAM) dies, static random-access memory (SRAM) dies, High-Bandwidth Memory (HBM) dies, Hybrid Memory Cubes (HMC) dies, or the like, or a combination thereof. In some alternative embodiments, the second die 1320 may include both memory dies and a memory controller, such as, for example, a stack of four or eight memory dies with a memory controller. The said memory stack may be laterally encapsulated by an encapsulant such as a molding compound.

FIG. 15 illustrates an enlarged views of a joint structure 1330 in accordance with some embodiments.

Referring to FIG. 15, the joint structure 1330 may include an under bump metallurgy (UBM) structure 1510, the solder layer 1360, and a bond pad 1326. In some embodiments, the UBM structure 1510 includes a barrier layer 1508 embedded in the dielectric layer 1206 and the metal layer 1506 on the barrier layer 1508. In detail, the barrier layer 1508 may include a main body portion 1502 and a protruding portion 1504. The main body portion 1502 may be embedded in the dielectric layer 1206 and vertically sandwiched between the redistribution layer 1208 and the metal layer 1506. The protruding portion 1504 may extend from a sidewall of the main body portion 1502 to cover a portion of a top surface of the dielectric layer 1206. In some embodiments, the protruding portion 1504 has a bottom surface in direct contact with the portion of the top surface of the dielectric layer 1206. It should be noted that, in some embodiments, the sidewall of the barrier layer 1508 is laterally offset outward from the sidewall of the metal layer 1506. That is, a non-zero distance D2 is included between the sidewall of the barrier layer 1508 and the sidewall of the metal layer 1506. In some embodiments, the non-zero distance D2 is in a range from about 0.5 μm to about 20 μm, such as 2 μm. If the D2 is less than 0.5 μm, the solder layer 1360 may flow downward to directly contact the underlying RDL structure 1204. On the other hand, if the D2 is greater than 20 μm, the occupied area of the barrier layer 150 is too large, thereby affecting the design of the metal routing. In some embodiments, the material of the barrier layer 1508 is different from the material of the metal layer 1506. More specifically, the barrier layer 1508 is configured to have a metal material that is more difficult to form an intermetallic compound (IMC) with the solder layer 1360 than the metal layer 1506. For example, the metal layer 1506 is a copper (Cu) layer, and the barrier layer 1508 is a nickel (Ni) layer. In such embodiment, the wider barrier layer 1508 is able to prevent the solder layer 1360 from contacting the underlying redistribution layers 1208 and the dielectric layer 1206. As such, the dielectric delamination issue is avoided, thereby enhancing the reliability and yield of the joint structure 1330 of the package structure.

In some embodiments, the joint structure 1330 further includes an IMC layer 1512 formed between the solder layer 1360 and the metal layer 1506. Specifically, the IMC layer 1512 may overlay a top surface and a sidewall of the metal layer 1506. The material (such as Sn) of the solder layer 1360 and the material (such as Cu) of the metal layer 1506 may migrate and react with each other to form the IMC layer 1512. That is, the material of the IMC layer 1512 may be derived or formed from the metal layer 1506 and the solder layer 1360. The IMC layer 1512 may be referred to as an intermetallic alloy, an ordered intermetallic alloy, or a long-range-ordered alloy. The IMC layer 1512 is a solid-state compound containing two or more metallic elements, and exhibits metallic bonding and ordered crystal structure. In some embodiments, the IMC layer 1512 include $Cu_6Sn_5$ or another suitable material. It should be noted that, in the present embodiment, the protruding portion 1504 of the barrier layer 1508 physically separates the IMC layer 1512 from the dielectric layer 1206. That is, the IMC layer 1512 is not direct in contact with the dielectric layer 1206. In this case, the high stress caused by the IMC layer 1512 is not directly applied to the dielectric layer 1206. As such, the dielectric delamination issue and the dielectric crack issue are further avoided.

FIG. 16 illustrates an enlarged views of a joint structure 1330′ in accordance with some alternative embodiments.

Referring to FIG. 16, the joint structure 1330′ may include an UBM structure 1510′, the solder layer 1360, and a bond pad 1326. In some embodiments, the UBM structure 1510′ includes a first metal layer 1518 embedded in the dielectric layer 1206; a second metal layer 1506 disposed on the first metal layer 1518; and a barrier layer 1508 vertically disposed between the first metal layer 1518 and the second metal layer 1506. The first metal layer 1518 may have a lower portion 1518a embedded in the dielectric layer 1206; and an upper portion 1518b disposed on the lower portion 1518a and extending to cover a portion of a top surface of the dielectric layer 1206. Similarly, a sidewall of the barrier layer 1508 may protrude from a sidewall of the second metal layer 1506 to a non-zero distance, and the barrier layer 1508 is configured to have a metal material that is more difficult to form an IMC with the solder layer 1360 than the second metal layer 1506. In such embodiment, the barrier layer 1508 is able to prevent the solder layer 1360 from contacting the underlying redistribution layers 1208 and the dielectric layer 1206. As such, the dielectric delamination issue is avoided, thereby enhancing the reliability and yield of the joint structure 1330′ of the package structure. In addition, the first metal layer 1518 may increase the vertical distance between the solder layer 1360 and the dielectric layer 1206, so as to prevent the solder layer 1360 from wetting and contacting the dielectric layer 1206.

In some embodiments, the joint structure 1330′ further includes the IMC layer 1512 formed between the solder layer 1360 and the metal layer 1506. In the present embodiment, the barrier layer 1508 physically separates the IMC layer 1512 from the dielectric layer 1206. That is, the IMC layer 1512 is not direct in contact with the dielectric layer 1206. In this case, the high stress caused by the IMC layer 1512 is not directly applied to the dielectric layer 1206. As such, the dielectric delamination issue and the dielectric crack issue are further avoided.

Referring back to FIG. 14, after mounting the first die 1310 and the second die 1320, an encapsulant 1410 is formed to laterally encapsulate the first die 1310 and the second die 1320, thereby accomplishing the package structure. In some embodiments, the encapsulant 1410 includes an epoxy, an organic polymer, a polymer with or without a silica-based or glass filler added, or other materials, as examples. In some embodiments, the encapsulant 1410 includes a liquid molding compound (LMC) that is a gel type liquid when applied. The encapsulant 1410 may also include a liquid or solid when applied. Alternatively, the encapsulant 1410 may include other insulating and/or encapsulating materials.

In some embodiments, the encapsulant 1410 is formed by using a wafer level molding process, such as a compressive molding process, a transfer molding process, or other processes. Next, a material of the encapsulant 1410 is cured by using a curing process, in some embodiments. The curing process may include heating the material of the encapsulant 1410 to a predetermined temperature for a predetermined period of time, using an anneal process or other heating process. The curing process may also include an ultra-violet (UV) light exposure process, an infrared (IR) energy exposure process, combinations thereof, or a combination thereof with a heating process. Alternatively, the material of the encapsulant 1410 may be cured by using other methods. In some alternative embodiments, a curing process is not included.

Moreover, although the said embodiment uses the CoWoS structure as an example to illustrate the packaging structure with the joint structure 1330 or 1330′, the embodiments of the present invention are not limited thereto. In other embodiments, the joint structure 1330 or 1330′ may be applied to any suitable package structure, such as PoP package structure, InFO package structure, SoIC package structure, or the like.

According to some embodiments, a package structure having a joint structure is provided. The joint structure includes: a first under bump metallurgy (UBM) structure, disposed on a first dielectric layer, wherein the first UBM structure at least comprises: a barrier layer, embedded in the first dielectric layer; and an upper metal layer, disposed on the barrier layer, wherein a sidewall of the barrier layer is laterally offset outward from a sidewall of the upper metal layer, and a portion of a top surface of the barrier layer is exposed by the first dielectric layer; and a solder layer, disposed on the first UBM structure and contacting the upper metal layer.

According to some embodiments, a package structure having a joint structure is provided. The joint structure includes: an UBM structure, disposed on a dielectric layer, wherein the UBM structure comprises: a first metal layer embedded in the dielectric layer; a second metal layer disposed on the first metal layer; and a barrier layer vertically disposed between the first metal layer and the second metal layer, wherein a sidewall of the barrier layer protrudes from a sidewall of the second metal layer to a non-zero distance, and the barrier layer is configured to have a metal material that is more difficult to form an intermetallic compound (IMC) than the second metal layer; a solder layer, overlying a top surface and a sidewall of the second metal layer; and an IMC layer, disposed between and being in contact with the solder layer and the second metal layer.

According to some embodiments, a method of forming a package structure includes: forming a seed layer on a carrier; sequentially forming a first metal layer and a barrier layer on the seed layer; performing a first etching process to remove the seed layer uncovered by the first metal layer and laterally etch a portion of the first metal layer, so that a sidewall of the barrier layer protrudes beyond a sidewall of the first metal layer to form an overhang structure; forming a dielectric layer to laterally encapsulate the first metal layer and the barrier layer; forming a first package component on the dielectric layer; releasing the carrier to expose a top surface of the first metal layer; performing a second etching process to remove a portion of the dielectric layer, thereby exposing a portion of the top surface of the barrier layer; and bonding a second package component onto the first package component through a solder layer, wherein the solder layer is in contact with the top surface of the first metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure having a joint structure, the joint structure comprising:
a first under bump metallurgy (UBM) structure, at least comprising:
a barrier layer, embedded in a first dielectric layer; and
an upper metal layer, covering a first portion of a top surface of the barrier layer to expose a second portion of the top surface of the barrier layer, wherein a width measured by opposite sidewalls of the barrier layer is greater than a width measured by opposite sidewalls of the upper metal layer, and the second portion of the top surface of the barrier layer is exposed by the first dielectric layer; and
a solder layer, disposed on the first UBM structure and contacting the upper metal layer.

2. The package structure of claim 1, wherein a non-zero distance is included between the sidewall of the barrier layer and the sidewall of the upper metal layer, and the non-zero distance is in a range from 0.5 μm to 20 μm.

3. The package structure of claim 1, further comprising: a lower metal layer, wherein the barrier layer is vertically sandwiched between the lower metal layer and the upper metal layer.

4. The package structure of claim 3, wherein a material of the barrier layer is different from a material of the lower metal layer and/or the upper metal layer.

5. The package structure of claim 3, wherein the barrier layer comprises:
a main body portion, embedded in the first dielectric layer and vertically sandwiched between the lower metal layer and the upper metal layer; and
a protruding portion, extending from a sidewall of the main body portion to cover a portion of a top surface of the first dielectric layer.

6. The package structure of claim 5, wherein the protruding portion has a bottom surface in direct contact with the portion of the top surface of the first dielectric layer.

7. The package structure of claim 1, wherein a top surface of the first dielectric layer is substantially level with or lower than the top surface of the barrier layer.

8. The package structure of claim 1, further comprising: an intermetallic compound (IMC) layer disposed between the solder layer and the upper metal layer.

9. The package structure of claim 1, further comprising:
a second UBM structure disposed on a second dielectric layer, wherein the solder layer is sandwiched between the first UBM structure and the second UBM structure.

10. The package structure of claim 1, further comprising: an opening disposed in the first dielectric layer and laterally surrounding the upper metal layer and the solder layer, wherein the opening exposes the second portion of the top surface of the barrier layer.

11. A package structure having a joint structure, the joint structure comprising:
an UBM structure, comprising:
a first metal layer embedded in a dielectric layer;
a second metal layer disposed on the first metal layer; and
a barrier layer vertically disposed between the first metal layer and the second metal layer, wherein an interface between the barrier layer and the first metal layer is higher than a top surface of the dielectric layer, and the barrier layer is configured to have a metal material that is more difficult to form an intermetallic compound (IMC) than the second metal layer;
a solder layer, overlying a top surface and a sidewall of the second metal layer; and
an IMC layer, disposed between and being in contact with the solder layer and the second metal layer.

12. The package structure of claim 11, wherein a sidewall of the barrier layer protrudes from the sidewall of the second metal layer to a non-zero distance, and the non-zero distance is in a range from 0.5 μm to 20 μm.

13. The package structure of claim 11, wherein the first metal layer comprises:
a lower portion, embedded in the dielectric layer; and
an upper portion, disposed on the lower portion and extending to cover a portion of a top surface of the dielectric layer.

14. The package structure of claim 11, further comprising: a bond pad disposed over a package substrate, wherein the solder layer is sandwiched between the UBM structure and the bond pad.

15. A package structure having a joint structure, the joint structure comprising:
an UBM structure, at least comprising:
a barrier layer, embedded in a dielectric layer; and
an upper metal layer, disposed over the barrier layer, wherein a sidewall of the barrier layer is laterally offset outward from a sidewall of the upper metal layer; and
a solder layer, disposed on the UBM structure and contacting the upper metal layer; and
an opening disposed in the dielectric layer and laterally surrounding the upper metal layer and the solder layer, wherein the opening exposes a portion of a top surface of the barrier layer.

16. The package structure of claim 15, wherein a non-zero distance is included between the sidewall of the barrier layer and the sidewall of the upper metal layer, and the non-zero distance is in a range from 0.5 μm to 20 μm.

17. The package structure of claim 15, further comprising: a lower metal layer, wherein the barrier layer is vertically sandwiched between the lower metal layer and the upper metal layer.

18. The package structure of claim 17, wherein a material of the barrier layer is different from a material of the lower metal layer and/or the upper metal layer.

19. The package structure of claim 15, wherein the opening extends from the top surface of the dielectric layer to the top surface of the barrier layer.

20. The package structure of claim 15, further comprising: a bond pad disposed over a package substrate, wherein the solder layer is sandwiched between the UBM structure and the bond pad.

* * * * *